US008037371B1

(12) United States Patent
Bikulcius et al.

(10) Patent No.: US 8,037,371 B1
(45) Date of Patent: Oct. 11, 2011

(54) APPARATUS AND METHOD FOR TESTING HIGH-SPEED SERIAL TRANSMITTERS AND OTHER DEVICES

(75) Inventors: Simon Bikulcius, San Jose, CA (US); Vadim Tsinker, Belmont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 645 days.

(21) Appl. No.: 11/803,231

(22) Filed: May 14, 2007

(51) Int. Cl.
G06K 5/04 (2006.01)
G11B 5/00 (2006.01)
G11B 20/20 (2006.01)

(52) U.S. Cl. ......... 714/700; 714/724; 375/224; 375/226
(58) Field of Classification Search .................. None
See application file for complete search history.

(56) References Cited

U.S. PATENT DOCUMENTS

| | | | |
|---|---|---|---|
| 2,950,437 A | 8/1960 | Stahl | |
| 2,952,810 A | 9/1960 | Helton | |
| 2,996,666 A | 8/1961 | Baker | |
| 3,082,374 A | 3/1963 | Buuck | |
| 3,219,927 A | 11/1965 | Topp, Jr. et al. | |
| 3,237,100 A | 2/1966 | Chalfin et al. | |
| 3,319,166 A | 5/1967 | Coleman | |
| 3,487,304 A | 12/1969 | Kennedy | |
| 3,492,572 A | 1/1970 | Jones et al. | |
| 3,522,532 A | 8/1970 | McCoy | |
| 3,541,441 A | 11/1970 | Hrustich | |
| 3,976,940 A | 8/1976 | Chau et al. | |
| 4,092,589 A | 5/1978 | Chau et al. | |
| RE31,056 E | 10/1982 | Chau et al. | |
| 4,596,026 A * | 6/1986 | Cease et al. | 375/372 |
| 4,975,596 A * | 12/1990 | Thomas et al. | 327/67 |
| 5,404,577 A | 4/1995 | Zuckerman et al. | |
| 5,802,463 A | 9/1998 | Zuckerman | |
| 5,835,501 A | 11/1998 | Dalmia et al. | |
| 6,008,663 A | 12/1999 | Takabe | |
| 6,169,912 B1 | 1/2001 | Zuckerman | |
| 6,259,666 B1 * | 7/2001 | Kobayashi et al. | 369/59.11 |
| 6,301,190 B1 * | 10/2001 | Tsujino et al. | 365/233.12 |
| 6,484,280 B1 * | 11/2002 | Moberly | 714/726 |
| 6,586,924 B1 | 7/2003 | Okayasu et al. | |
| 6,747,469 B2 | 6/2004 | Rutten | |
| 6,882,139 B2 | 4/2005 | Grebner et al. | |
| 7,035,324 B2 | 4/2006 | Mar et al. | |

(Continued)

OTHER PUBLICATIONS

Stephen Sunter et al., "On-Chip Digital Jitter Measurement, from Megahertz to Gigahertz," Testing at MultiGbps Rates, IEEE Design & Test of Computers, 2004, pp. 314-321.

(Continued)

*Primary Examiner* — Jeffrey A Gaffin
*Assistant Examiner* — Steve Nguyen (57) ABSTRACT

A testing device for testing a high-speed serial transmitter or other device includes an input stage having a first comparator, a second comparator, and a digital-to-analog converter. The first comparator compares first differential signals from a device under test. The second comparator compares the first differential signals and second differential signals from the digital-to-analog converter. An analysis unit identifies first beats based on an output of the first comparator and second beats based on an output of the second comparator. The analysis unit identifies one or more characteristics of the device under test (such as jitter, differential signal swing, and transition time) based on the first and second beats. A clock unit provides an adjustable clock signal to the comparators. The clock signal may have a frequency shift with respect to a frequency of the device under test.

20 Claims, 7 Drawing Sheets

U.S. PATENT DOCUMENTS

| | | | |
|---|---|---|---|
| 7,096,139 | B2 | 8/2006 | Miyazaki et al. |
| 7,113,749 | B2 * | 9/2006 | Smith et al. ............... 455/67.11 |
| 7,190,155 | B2 | 3/2007 | Washizu |
| 7,193,407 | B2 | 3/2007 | Washizu |
| 7,237,167 | B2 | 6/2007 | Inaba et al. |
| 7,275,197 | B2 | 9/2007 | Inaba et al. |
| 7,543,202 | B2 | 6/2009 | Matsubara et al. |
| 7,574,633 | B2 | 8/2009 | Sato et al. |
| 2003/0020488 | A1 | 1/2003 | Grebner et al. |
| 2003/0031241 | A1 | 2/2003 | Mar et al. |
| 2003/0085726 | A1 | 5/2003 | Rutten |
| 2003/0175037 | A1 | 9/2003 | Kimmitt et al. |
| 2005/0182583 | A1 | 8/2005 | Miyazaki et al. |
| 2005/0193298 | A1 | 9/2005 | Inaba et al. |
| 2005/0240852 | A1 | 10/2005 | Inaba et al. |
| 2007/0035288 | A1 | 2/2007 | Washizu |
| 2007/0035289 | A1 | 2/2007 | Washizu |
| 2007/0052427 | A1 | 3/2007 | Washizu |
| 2007/0250743 | A1 | 10/2007 | Matsubara et al. |
| 2008/0012576 | A1 | 1/2008 | Sato et al. |

OTHER PUBLICATIONS

Dongwoo Hong et al., "An Efficient Random Jitter Measurement Technique Using Fast Comparator Sampling," Proceedings of the 23rd IEEE VLSI Test Symposium, 2005, 8 pages.

Ulrich L. Rohde et al., "Communications Receivers: Principles and Design", Frequency Control and Local Oscillators, McGraw-Hill, Second Edition, 5 pages.

L. Schiano et al., "Measuring the Timing Jitter of ATE in the Frequency Domain", Jun. 29, 2004, pp. 1-16.

"Jitter Measurements for CLK Generators or Synthesizers", Dallas Semiconductor, Sep. 26, 2003, 6 pages.

Un-Ku Moon et al., "Spectral Analysis of Time-Domain Phase Jitter Measurements", IEEE Transactions on Circuits and Systems-II: Analog and Digital Signal Processing, vol. 49, No. 5, May 2002, pp. 321-327.

"Phase Noise Measurements, Convert Time Interval Error Into Phase Noise", LeCroy Application Brief No. LAB 744, 4 pages.

M. Takamiya et al., "On-Chip Jitter-Spectrum Analyzer for High-Speed Digital Designs", NEC, 27 pages.

Joseph V. Adler, "Clock-source jitter: A clear understanding aids oscillator selection", www.ednmag.com, Feb. 18, 1999, pp. 79-86.

Neil Roberts, "Phase noise and jitter—a primer for digital designers", EEdesign.com, Jul. 14, 2003, 7 pages.

Algie L. Lance et al., "Phase Noise and AM Noise Measurements in the Frequency Domain", Infrared and Millimeter Waves, vol. 11, 1984, pp. 239-289.

Warren F. Walls, "Practical Problems Involving Phase Noise Measurements", 33rd Annual Precise Time and Time Interval (PTTI) Meeting, pp. 407-416.

Morris Smith, "Phase Noise Measurement Using the Phase Lock Technique", Motorola, Inc., 1999, 12 pages.

Warren F. Walls, "Cross-Correlation Phase Noise Measurements", 1992 IEEE Frequency Control Symposium, pp. 257-261.

D.B. Sullivan et al., "Characterization of Clocks and Oscillators", 13 pages.

"Advanced Phase Noise and Transient Measurement Techniques", Agilent Technologies, Oct. 5, 2004, 8 pages.

"PN9000 Automated Phase Noise Measurement System Application Note #2", Aeroflex, 2003, 20 pages.

"Jitter in Clock Sources", Vectron International, May 23, 2005, 9 pages.

Pankaj Goyal, "Theory and Practical Considerations for Measuring Phase Noise Better Than-165 dBc/Hz: Part I", Microwave Journal, Oct., Nov. 2004, 29 pages.

"Measurement of Frequency Stability and Phase Noise", Aeroflex, Aug. 2005, 8 pages.

Stephen Sunter, et al., "An Automated, Complete, Structural Test Solution for SERDES", ITC International Test Conference, 2004 IEEE, p. 95-104.

Lawrence H. Zuckerman, "Apparatus and Method for Measuring Phase Noise/Jitter in Devices Under Test" 105 pages.

* cited by examiner

APPARATUS AND METHOD FOR TESTING HIGH-SPEED SERIAL TRANSMITTERS AND OTHER DEVICES

TECHNICAL FIELD

This disclosure is generally directed to testing systems and more specifically to an apparatus and method for testing high-speed serial transmitters and other devices.

BACKGROUND

Serial transmitters are used in a wide variety of electronic devices, such as personal computer motherboards and cellular mobile base stations. These serial transmitters typically transmit data serially at a very high rate of speed, often up to several hundred megahertz, several gigahertz, or even more. High-speed serial transmitters are, however, typically very difficult to test during the production process. For example, testing a high-speed serial transmitter often requires expensive lab equipment or equipment upgrades for production testing. As a result, some important characteristics of a serial transmitter are often not tested during the production process. This typically increases the likelihood that an untested transmitter will prematurely fail or otherwise not meet a required specification. Not only that, parameters that could be tested during the production process often have their own individual challenges, making any testing of the transmitters quite difficult.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 10, discussed below, and the various embodiments used to describe the principles of the present invention in this patent document are by way of illustration only and should not be construed in any way to limit the scope of the present invention. Those skilled in the art will understand that the principles of the present invention may be implemented in any type of suitably arranged device or system.

Figure 1:
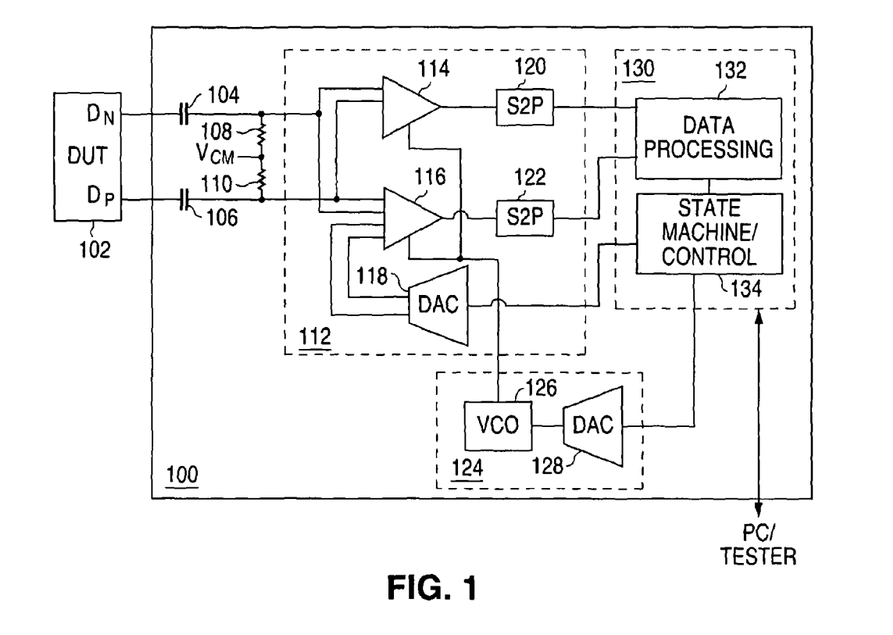
FIG. 1 illustrates an example testing device for testing a serial transmitter or other device in accordance with this disclosure.

FIG. 1 illustrates an example testing device 100 for testing a serial transmitter or other device in accordance with this disclosure. The embodiment of the testing device 100 shown in FIG. 1 is for illustration only. Other embodiments of the testing device 100 could be used without departing from the scope of this disclosure.

As shown in FIG. 1, the testing device 100 is used to test the operation of a device under test (DUT) 102. The device under test 102 represents any suitable device to be tested, such as a high-speed serial transmitter. In this example, the device under test 102 generates differential output signals ($D_P$ and $D_N$), which are provided to the testing device 100 for analysis.

In this example embodiment, the differential output signals from the device under test 102 are provided to two capacitors 104-106. Two resistors 108-110 are coupled in series between the outputs of the capacitors 104-106. A common mode voltage $V_{CM}$ associated with the differential output signals from the device under test 102 is generated between the resistors 108-110.

The outputs of the capacitors 104-106 are provided to an input stage 112 of the testing device 100. The input stage 112 captures various information about the differential output signals from the device under test 102. In this example, the input stage 112 includes two latched comparators 114-116 and a digital-to-analog converter (DAC) 118. The input stage 112 may also include two serial-to-parallel converters (S2P) 120-122. In some embodiments, the input stage 112 is formed in a single semiconductor chip. The input stage 112 is coupled to a clock unit 124, which includes a voltage-controlled oscillator (VCO) 126 and a digital-to-analog converter (DAC) 128. The input stage 112 and the clock unit 124 are coupled to an analysis unit 130, which in this example includes a data processing unit 132 and a state machine/controller 134.

The comparators 114-116 in the input stage 112 compare input voltages and generate output signals based on the comparisons. For example, the comparator 114 compares the differential signals from the device under test 102 to one another, thereby identifying when the differential signals meet or cross each. The comparator 114 may therefore be referred to as a common mode-referenced comparator, and the output of this comparator 114 may be referred to as a common mode-referenced comparator output. The comparator 116 compares the differential signals from the device under test 102 and differential outputs from the digital-to-analog converter 118. The comparator 116 may therefore be referred to as a DAC-referenced comparator, and the output of this comparator 116 may be referred to as a DAC-referenced comparator output. Each of the comparators 114-116 includes any suitable structure for comparing inputs and providing a resulting output. Each of the comparators 114-116 could, for example, include a high-speed comparator capable of performing pico-second sampling followed by a D flip-flop or other latch.

The digital-to-analog converter 118 receives digital inputs from the analysis unit 130 and generates corresponding analog differential outputs, which are provided to the comparator 116. The digital-to-analog converter 118 includes any suitable structure for generating analog differential outputs based on digital inputs.

The serial-to-parallel converters 120-122 convert serial data from the latched comparators 114-116 into parallel data for use by the analysis unit 130. The serial-to-parallel converters 120-122 could, for example, convert serial data into 10-bit parallel data. This may be useful, for example, when the analysis unit 130 requires a lower data rate than the serial data rate of the comparators 114-116. Each of the serial-to-parallel converters 120-122 includes any suitable structure for converting serial data into parallel format.

In the clock unit 124, the voltage-controlled oscillator 126 generates a clock signal that controls the latching performed by the comparators 114-116. The voltage-controlled oscillator 126 is controlled by the digital-to-analog converter 128, which receives digital inputs from the analysis unit 130 and generates control voltages for the voltage-controlled oscillator 126. The voltage-controlled oscillator 126 includes any suitable structure for generating a clock signal. The digital-to-analog converter 128 includes any suitable structure for generating an analog output based on a digital input.

The analysis unit 130 analyzes the data provided by the input stage 112 to determine one or more characteristics of the device under test 102. For example, the data processing unit 132 could analyze the data from the comparators 114-116 to measure one or more characteristics of a high-speed serial transmitter. The results of the testing could then be made available to an external component, such as by providing the measured characteristics to a personal computer (PC) or external tester over a serial peripheral interface (SPI) or other interface. During the testing, the state machine/controller 134 could alter the digital values provided to the digital-to-analog converters 118 and 128 to adjust the operations of the input stage 112 and the clock unit 124. The analysis unit 130 includes any suitable hardware, software, firmware, or combination thereof for identifying one or more characteristics associated with a device being tested. The analysis unit 130 could, for example, include one or more field programmable gate arrays (FPGAs).

In one aspect of operation, the analysis unit 130 could measure the jitter, differential swing, and/or transition time of the device under test 102. The differential swing and transition time can be determined using outputs from both comparators 114-116, and the jitter can be determined using outputs from the comparator 114. The analysis unit 130 could also test the signal de-emphasis or pre-emphasis of the device under test 102 during the testing.

During testing, the period of the voltage-controlled oscillator 126 can be shifted by a small amount of time so that the period of the differential signals from the device under test 102 is slightly different than the sampling period of the comparators 114-116. The comparators 114-116 therefore produce outputs having a beat period, and the analysis unit 130 can analyze the comparator outputs to measure the jitter, differential swing, and transition time of the device under test 102. The period of the voltage-controlled oscillator 126 can also be fine tuned by the analysis unit 130 to produce a correct beat period output from the comparators 114-116. Additional details regarding the specific functions and computations used to measure jitter, differential swing, and transition time are provided below.

In particular embodiments, the testing device 100 may operate using the parameters provided in Table 1. These are for illustration only and describe a single possible implementation of the testing device 100.

TABLE 1

| Description | Conditions | Min | Typical | Max | Units |
| --- | --- | --- | --- | --- | --- |
| Input data rate ($D_P/D_N$) | | | 2.5 | 3.5 | Gb/s |
| Cycle to cycle jitter | External VCO | | 2.3 | | pS |
| Differential input swing | | 200 | | 820 | mV |
| Edge detection | | | 40 | | pS |
| Jitter floor | Pk to Pk | | 10 or 15-20 | | pS |

Although FIG. 1 illustrates one example of a testing device 100 for testing a serial transmitter or other device, various changes may be made to FIG. 1. For example, the functional division shown in FIG. 1 is for illustration only. Various components in FIG. 1 could be combined or omitted and additional components could be added according to particular needs. As a particular example, the serial-to-parallel converters 120-122 could be omitted, such as when the analysis unit 130 is capable of handling the serial data from the comparators 114-116. As another particular example, the input stage 112 could be placed on a module card or other structure with FPGA programming that implements the analysis unit 130. Further, different components could be used to provide the functions performed by the illustrated components in the testing device 100. As a particular example, any other clock source could be used in place of the voltage-controlled oscillator 126. In addition, the testing device 100 test multiple devices 102 simultaneously, such as by having an extended input and output port width.

Figure 2:
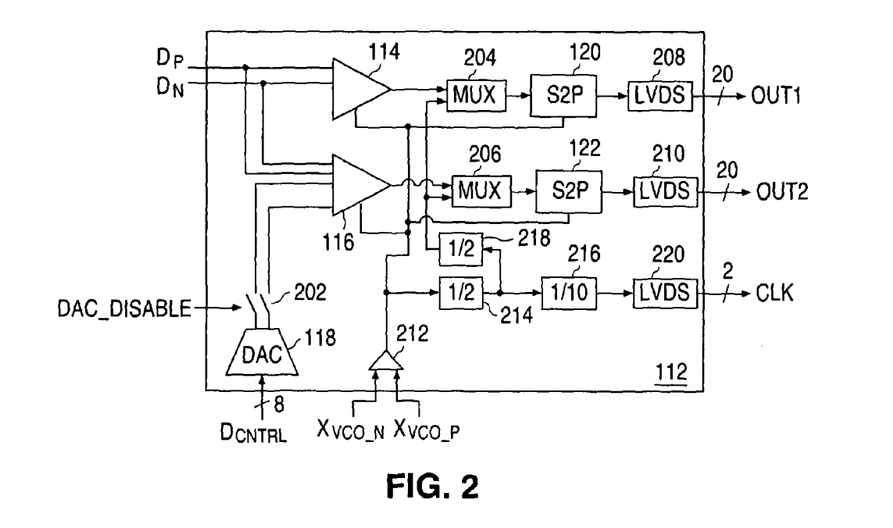
FIG. 2 illustrates an example input stage of a testing device for testing a serial transmitter or other device in accordance with this disclosure.

FIG. 2 illustrates an example input stage 112 of a testing device 100 for testing a serial transmitter or other device in accordance with this disclosure. The embodiment of the input stage 112 shown in FIG. 2 is for illustration only. Other embodiments of the input stage 112 could be used without departing from the scope of this disclosure.

As shown in FIG. 2, a large portion of the input stage 112 operates using current mode logic (CML). The comparators 114-116 receive differential signals ($D_P$ and $D_N$) from the device under test 102. The comparator 116 also receives differential signals from the digital-to-analog converter 118. In this example, the digital-to-analog converter 118 operates by receiving an 8-bit digital signal $D_{CNTRL}$ and converting the digital signal into a corresponding differential signal. The digital-to-analog converter 118 could operate in current mode and use one or more external resistors (such as two 170Ω termination resistors to ground). A disable signal DAC_DISABLE can be used to open two switches 202 coupling the digital-to-analog converter 118 to the comparator 116.

The outputs of the comparators 114-116 are provided to multiplexers (MUX) 204-206, respectively. Each of the multiplexers 204-206 selects one of two inputs for output. The outputs of the multiplexers 204-206 are coupled to the serial-to-parallel converters 120-122, which could represent 1:10 converters. The parallel data from the converters 120-122 is provided to low voltage differential signaling (LVDS) units 208-210, respectively, which output the parallel data in differential form using double data rate (DDR). If the parallel data represents 10-bit data, the outputs of the LVDS units 208-210 are communicated over 20 lines.

Differential signals (denoted $X_{XVO\_P}$ and $X_{VCO\_N}$) from the voltage-controlled oscillator 126 are provided to a buffer 212, which produces an actual clock signal for the latched comparators 114-116 and the serial-to-parallel converters 120-122. The clock signal is also provided to a clock divider 214, which slows the frequency of the clock signal by half. This may be useful, for example, when the VCO frequency is two times the data frequency. The output of the clock divider 214 is provided to two other clock dividers 216 and 218, which slow the frequency of the already-halved clock signal by a factor of ten and two, respectively. The factor of ten used by the clock divider 216 is based on the 1:10 parallelization provided by the serial-to-parallel converters 120-122. This leads to the creation of an output clock signal CLK produced by an LVDS unit 220 that is timed to the parallel data provided by the LVDS units 208-210. The clock signal output by the clock divider 218 can be selected by the multiplexers 204-206 and provided to the serial-to-parallel converters 120-122 for conversion and then to the LVDS units 208-210. This provides a simple pattern generator that can be used to check the signal path through the serial-to-parallel converters 120-122 and the LVDS units 208-210.

Although FIG. 2 illustrates one example of an input stage 112 of a testing device 100 for testing a serial transmitter or other device, various changes may be made to FIG. 2. For example, different components could be used to provide the functions performed by the illustrated components in the input stage 112. Also, various components in FIG. 2 could be combined or omitted and additional components could be added according to particular needs. As a particular example, the circuitry implementing the pattern generator for checking the signal path through the parallel-to-serial converters 120-122 and the LVDS units 208-210 could be omitted.

Figure 3:
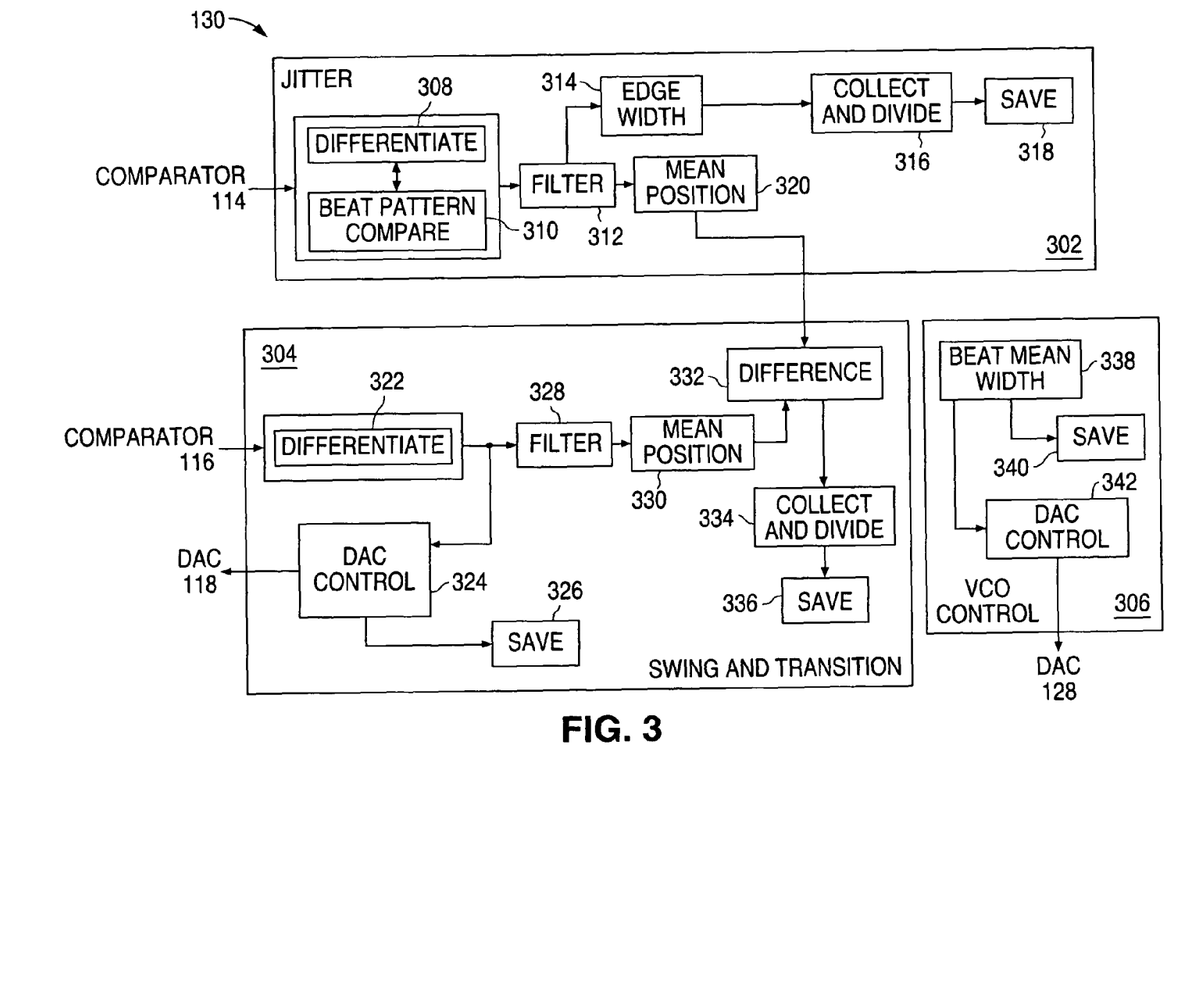
FIG. 3 illustrates an example analysis unit of a testing device for testing a serial transmitter or other device in accordance with this disclosure.

FIG. 3 illustrates an example analysis unit 130 of a testing device 100 for testing a serial transmitter or other device in accordance with this disclosure. Also, FIGS. 4 through 8 illustrate example measurements identified during testing of a serial transmitter or other device in accordance with this disclosure. The embodiment of the analysis unit 130 shown in FIG. 3 and the measurements shown in FIGS. 4 through 8 are for illustration only. Other embodiments of the analysis unit 130 and other measurements could be used without departing from the scope of this disclosure.

In some embodiments, the analysis unit 130 can be implemented using one or more FPGAs. In these or other embodiments, the analysis unit 130 could have the physical or logical structure shown in FIG. 3. The use of FPGAs may provide certain benefits depending on the implementation, such as providing flexibility for algorithm development or use as a memory device. Also, depending on the implementation, the physical or logical structure shown in FIG. 3 may not require extensive digital signal processing and can be performed on the fly.

As shown in FIG. 3, the functionality of the analysis unit 130 is divided into a jitter estimation section 302, a differential swing/transition time section 304, and a VCO control section 306. The operations of various ones of these sections are described with reference to FIGS. 4 through 8 in the following description.

In this embodiment, the operation of the analysis unit 130 is based on a beat concept. This approach involves using a clock with a slight frequency shift with respect to the device under test 102. This clock shift can be expressed as:

$$F_{shifted} = F\left(\frac{1}{1 +/_- N \cdot F}\right). \tag{1}$$

Here, F represents the sampling frequency of the device under test 102, and $F_{shifted}$ represents the frequency of the clock signal from the voltage-controlled oscillator 126. Also, N represents the time required to shift the frequency F to obtain $F_{shifted}$. The data provided by the latched comparators 114-116 has the frequency $F_{shifted}$.

Figure 4:
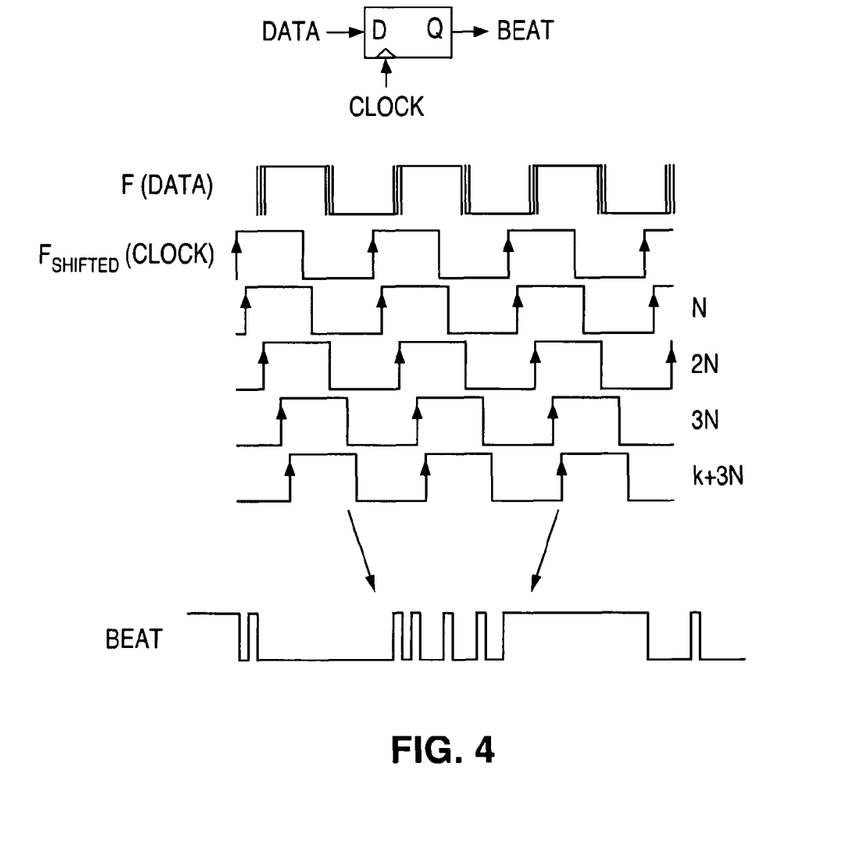
FIGS. 4 through 8 illustrate example measurements identified during testing of a serial transmitter or other device in accordance with this disclosure.

Since the comparators 114-116 are sampling data having frequency F, this creates output data from the comparators 114-116 in the form of a beat. An illustration of this is shown in FIG. 4. As shown in FIG. 4, as a clock moves through a data signal by an interval of time N, it samples the slightest variations of the edge crossings of the data signal as glitches. The voltage-controlled oscillator 126 can be programmed by the analysis unit 130 so that N cycles exist between each edge region in the data signal, which can be expressed as:

$$Beat_{samples} = \frac{\frac{1}{F}}{N}. \tag{2}$$

For example, if the data signal frequency is 1.25 GHz and N is 1 ps, there are 800 samples per beat.

There are various ways to extract useful data from the beats produced by the comparators 114-116. One technique includes differentiating the beat data. After that occurs, variations in the beat edges may be present every half of the clock period set by the interval N, and any number of mathematical operations can be performed (such as measuring peak-to-peak variations, generating histograms, and identifying variances).

Figure 5A:
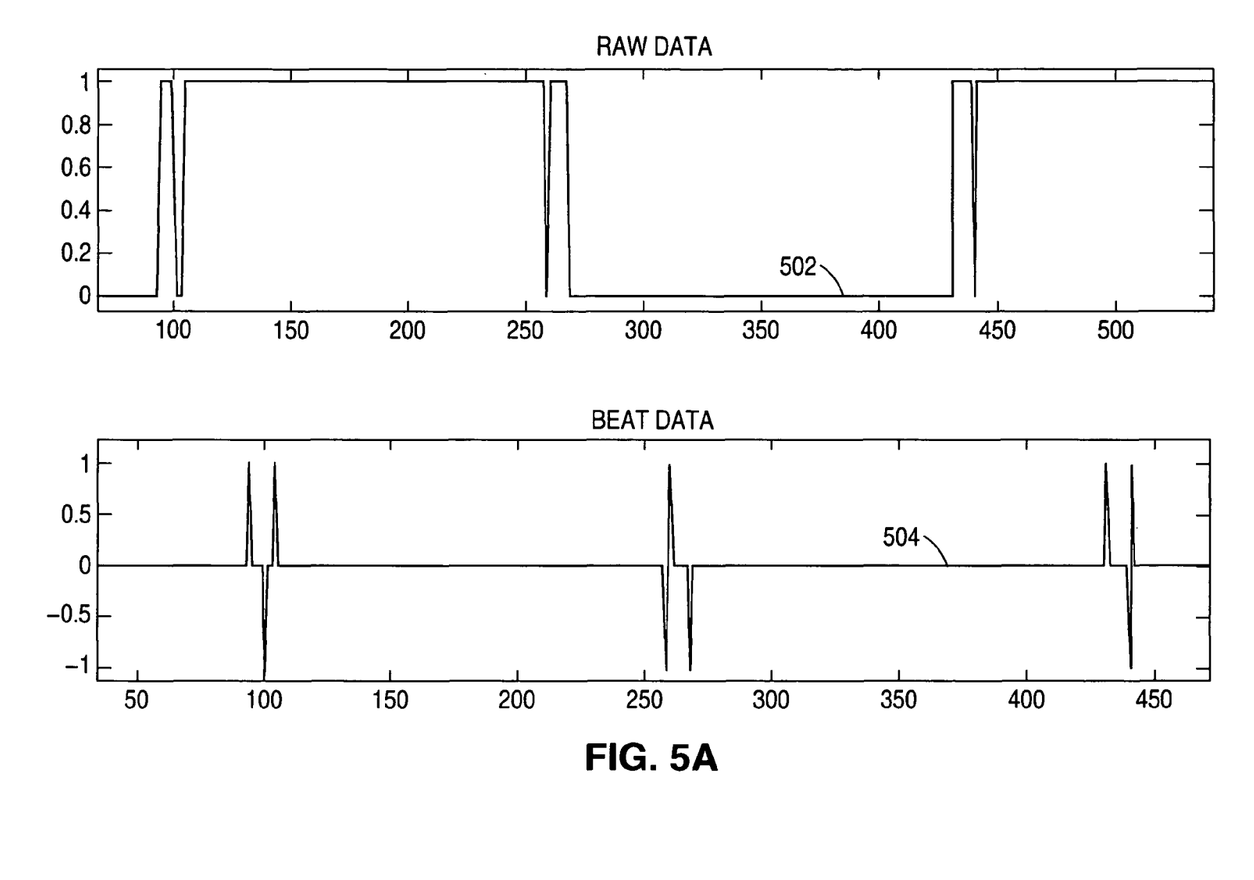
Figure 5B:
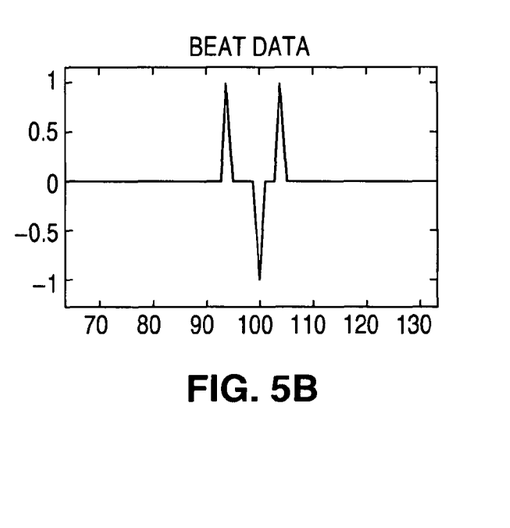

Examples of raw beat data from a comparator 114-116 and differentiated beat data produced by the analysis unit 130 are shown in FIGS. 5A and 5B. If the differential signals from the device under test 102 contain an alternating bit pattern with frequency F (compared to $F_{shifted}$ of the voltage-controlled oscillator 126), a beat pattern like that shown in FIGS. 5A and 5B can be produced. In FIG. 5A, line 502 represents the raw beat data produced by the comparator 114, and line 504 represents the differentiated beat data produced by the analysis unit 130. FIG. 5B represents an expanded portion of the line 504 containing a single beat in the differentiated beat data.

Among other things, jitter can be measured by variations in the edges of the beat data. By accumulating variation measurements for multiple edge regions of the beat data, statistics regarding jitter can be determined for the device under test 102. More specifically, the rising and falling edge variations of the beat data represent the jitter of the serial data stream. To isolate each edge region of the beat, the raw beat data is differentiated, and statistical techniques are used to measure the jitter. This is done using the output of the common mode-referenced latched comparator 114. Only the edges of the beat data may be of interest for jitter analysis, and the resolution can be set by N.

Based on this, in the jitter estimation section 302 of FIG. 3, the output of the comparator 114 is subjected to a differentiation function 308 and/or a beat pattern comparison function 310. In particular embodiments, depending on the clock frequency and pattern, two unique beat patterns can be compared to the output of the comparator 114. A filtering function 312 then occurs to prevent the start of calculations when there are erratic changes in edge regions of the beat data. As described in more detail below, the filtering can also be done to ensure that the differential swing/transition time section 304 is able to use the outputs of the comparator 114 as markers for the differential swing calculations. Filtering may further be necessary to prevent corruption of the data.

To determine the total jitter of the device under test 102, the jitter estimation section 302 identifies the average variation of the edges over a number of beat periods using an edge width measurement function 314 and a collect and divide function 316. The edge width measurement function 314 identifies the width of the edges in the beat periods. The collect and divide function 316 identifies and averages the variations in the width edges to identify the average variation of the edges over a number of beat periods. This can be expressed as:

$$J_{tot} = \frac{\sum_{n=1}^{k}[T(n)_{max} - T(n)_{min}]}{k}, \quad (3)$$

where $T(n)_{max}$ and $T(n)_{min}$ represent the first and last detectable changes in an edge of a particular beat, and k represents the total number of edges used. The resulting values are saved by function 318 in the jitter estimation section 302 as the identified jitter for the device under test 102. As described below, a mean position function 320 in the jitter estimation section 302 is used to provide relevant data to the differential swing/transition time section 304.

Figure 6:
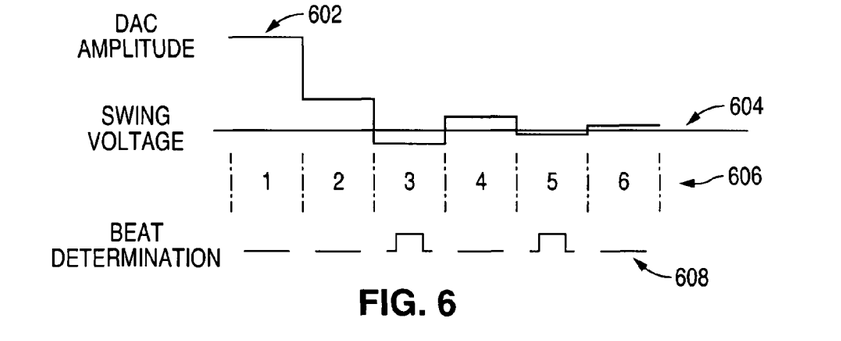

The differential swing of the device under test 102 can also be measured using the beat concept. The differential swing can be measured using the comparator 116 and the digital-to-analog converter 118. In this test, the presence of toggling (repeated switching between high and low values) in the output of the comparator 116 indicates that the output voltage of the digital-to-analog converter 118 nearly matches the swing of the differential signals from the device under test 102. For example, if the DAC's output voltage has its amplitude reduced each time period in a "power of two" fashion, a beat would appear once the voltage drops below the swing voltage. This is illustrated in FIG. 6, where line 602 represents the output voltage of the digital-to-analog converter 118 and line 604 represents the swing voltage of the device under test 102. During different time periods 606, a beat determination 608 is made as to whether the DAC output voltage exceeds or falls below the swing voltage.

In this example, the digital-to-analog converter 118 may operate like a successive approximation register, where the decision to increment or decrement the digital-to-analog converter value is based on whether a beat exists and continues during adjustment of the digital-to-analog converter 118. The last adjusted value of the digital-to-analog converter 118 may yield the differential swing of the device under test 102. As a particular example, the digital-to-analog converter 118 could represent an 8-bit differential DAC, and 128 possible selections of signal swing exist between 0 and 820 mV ($D_P - D_N = 1.640V$). The digital-to-analog converter 118 can be adjusted up to eight times in a "power of two" pattern to determine whether a beat is detectable. The digital-to-analog converter 118 is incremented when a beat is detected, and the digital-to-analog converter 118 is decremented if no beat is detected. The digital-to-analog converter 118 may therefore be controlled as expressed below:

$$dac\_code = \begin{cases} dac\_code - k(i), & \text{beat true} \\ dac\_code + k(i), & \text{beat false} \end{cases} \quad (4)$$

where dac_code represents the input to the digital-to-analog converter 118, and k(i) represents the value by which the dac_code is incremented or decremented. Equation (4) could be looped eight times, with the dac_code value initially at 128 and k stepped through eight values (k=[128 64 32 16 8 4 2 1]).

The transition time of the device under test 102 can also be measured using the beat concept. For example, the typical rise and fall time of data could be measured at 20/80% of the signal swing. The transition region can also include symmetry issues in the form of phase differences between the two differential signals. The testing device 100 may use the comparators 114-116 and the digital-to-analog converter 118 to perform the transition time analysis. By adjusting the digital-to-analog converter 118 to a 20/80 position of the comparator 116, the transition time can be measured through the beat it produces. This is illustrated in FIGS. 7 and 8.

Figure 7:
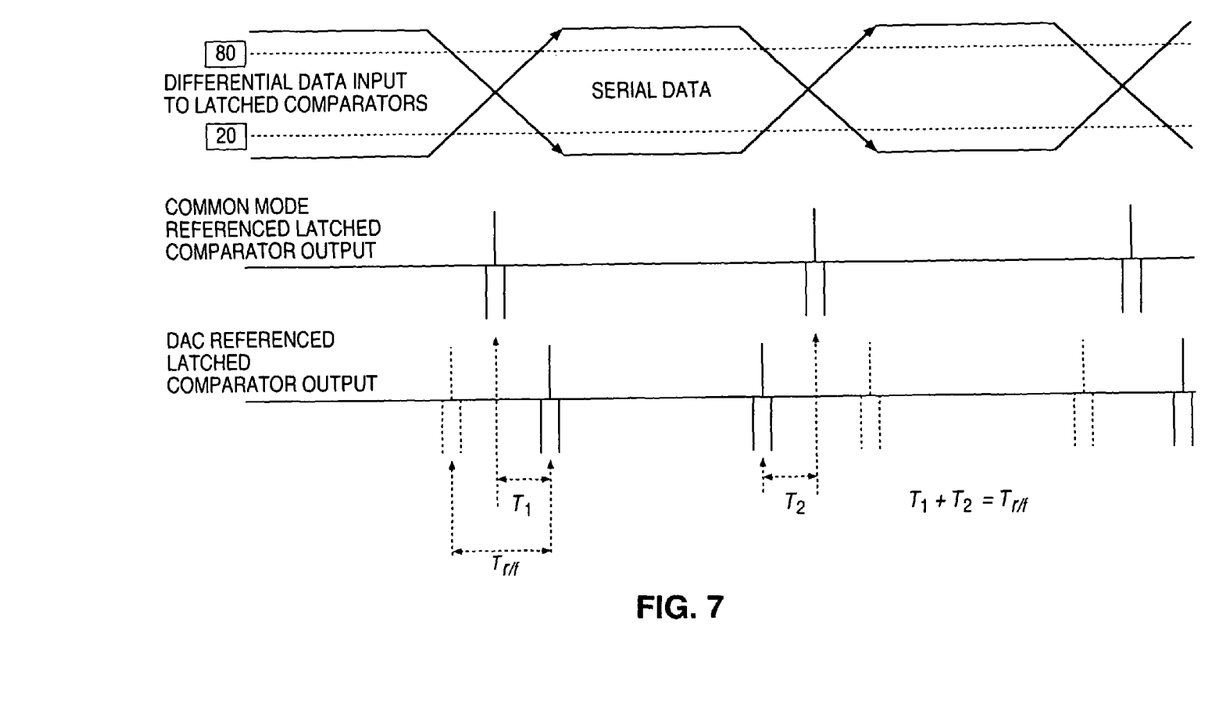
Figure 8:
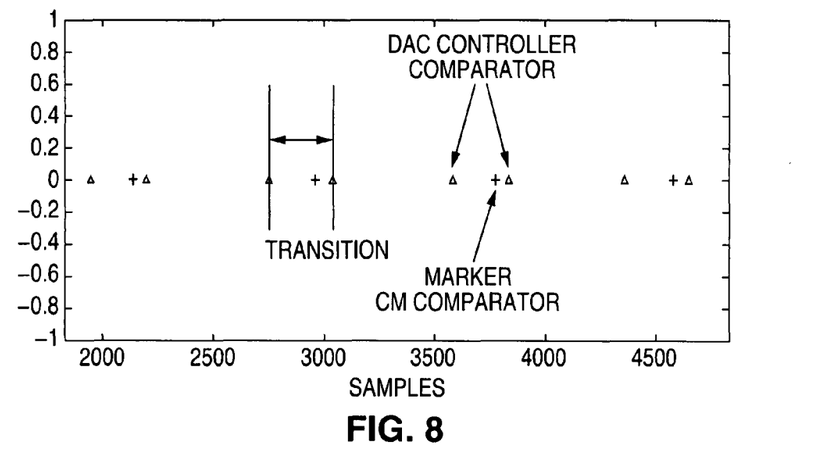

In FIG. 7, the transition time can be found by adjusting the DAC-referenced comparator 116 to a 20/80% of the differential swing using information gathered from the differential swing measurements. Each latched comparator edge region is averaged after differentiation of the beat to find its mean position relative to other edge regions. The beats from the common mode-referenced comparator 114 can be used as position markers, and the space ($T_{rf}$) between beats from the DAC-referenced comparator 116 can be measured.

The transition time can be measured in various ways. For example, the VCO frequency may be the same as the serial data frequency after differentiation. In this case, the transition time equals $T_1 + T_2$. This can be measured using differences in the positions of the beats from the DAC-referenced comparator 116 and from the common mode-referenced comparator 114 (as indicated by the solid beat lines for the comparators 114-116 in FIG. 7).

If the VCO frequency is two times the serial data frequency, the transition time may be found from the DAC-referenced comparator 116 revolving around position markers provided by the common mode-referenced comparator 114. The position markers in FIG. 7 are shown by both solid and dashed beat lines for the DAC-referenced comparator 116. This is also shown in FIG. 8, where each plus symbol (+) represents a beat identified by the common mode-referenced comparator 114 and each triangle symbol (Δ) represents a beat identified by the DAC-referenced comparator 116. The transition time here can be defined as the spacing of the triangle symbols on either side of a + marker. During this technique, the differentiated data may first be processed as follows:

$$D_2(n) = D(n+1) + D(n) \quad (5)$$

where D(n) represents the differentiated data, and $D_2(n)$ represents the processed differentiated data used to identify the transition time. To improve the accuracy of the transition time and differential swing measurements, multiple values can be obtained using the above analyses and averaged.

To support this functionality, the differential swing/transition time section 304 in FIG. 3 includes a differentiation function 308 that processes the output data of the comparator 116. The differentiated data is provided to a DAC control function 324, which generates outputs for controlling the digital-to-analog converter 118. This control function 324 could, for example, adjust the digital-to-analog converter 118 as shown above in Equation (4) to help identify the differential swing of the device under test 102. The values provided to the digital-to-analog converter 118 by the control function 324 can be saved by function 326.

The differentiated data is also provided to a filtering function 328, which filters the differentiated data. A mean position function 330 identifies the average position of beats in the data from the comparator 116. The mean position function 320 in the jitter estimation section 302 similarly determines the average position of beats in the data from the comparator 114. A difference function 332 identifies the differences in these identified positions, which provides an indication of the transition time of the device under test 102. Multiple transition times can be collected and averaged using a collect and divide function 334, and the resulting values can be saved by function 336.

The VCO control section 306 in FIG. 3 includes a beat mean width function 338, which identifies the average width of the beats identified by the jitter estimation section 302. These values can be saved by function 340 and are used by a DAC control function 342 to control the digital-to-analog converter 128. In this way, the VCO control section 306 can finely adjust the frequency of the voltage-controlled oscillator 126 and allow for repeated calibrations during use.

Although FIG. 3 illustrates one example of an analysis unit 130 of a testing device 100 for testing a serial transmitter or other device, various changes may be made to FIG. 3. For example, various components in FIG. 3 could be combined or omitted and additional components could be added according to particular needs. Also, any other suitable structure could be used to measure the jitter, differential swing, and/or transition time of the device under test 102. Although FIGS. 4 through 8 illustrate examples of measurements identified during testing of a serial transmitter, various changes may be made to FIGS. 4 through 8. For example, the jitter, differential swing, and transition time could be measured in any other or additional ways by the analysis unit 130.

Figure 9:
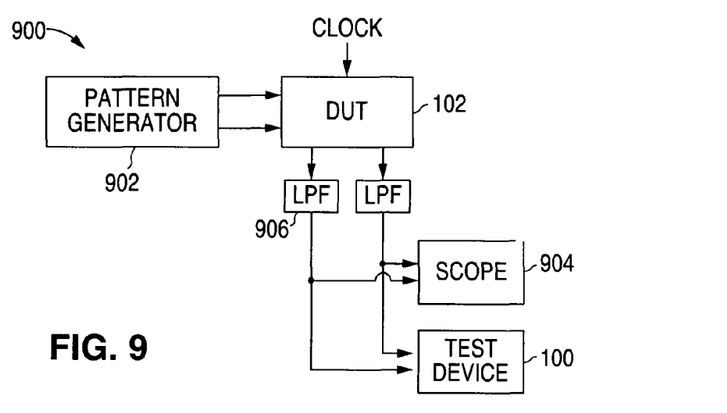
FIG. 9 illustrates an example testing system for testing a serial transmitter or other device in accordance with this disclosure.

FIG. 9 illustrates an example testing system 900 for testing a serial transmitter or other device in accordance with this disclosure. The embodiment of the testing system 900 shown in FIG. 9 is for illustration only. Other embodiments of the testing system 900 could be used without departing from the scope of this disclosure.

In this example, a pattern generator 902 is coupled to the device under test 102, such as a high-speed transmitter. The pattern generator 902 provides a specified pattern of data to the device under test 102 in order to test the operation of the device under test 102. In this example, the pattern generator 902 provides differential signals to the device under test 102. The pattern of data from the pattern generator 902 could have any suitable frequency, such as 2.4576 Gbps. The device under test 102 also receives a clock signal with a specified frequency, such as a 30.7 MHz clock.

The device under test 102 operates to produce differential output signals, such as by transmitting the data received from the pattern generator 902 using the differential output signals. The differential output signals are provided to the testing device 100 and to a scope 904. The testing device 100 analyzes the differential output signals and identifies one or more characteristics of the device under test 102 as described above. The scope 904 displays the differential output signals for viewing and possible visual analysis by a user.

In this example, the differential output signals could optionally be filtered by two low-pass filters 904 before being provided to the testing device 100. The low-pass filters 904 can be used to test the signal de-emphasis or pre-emphasis of the device under test 102. Here, the de-emphasis or pre-emphasis of the device under test 102 can be tested in conjunction with the jitter, differential signal swing, and transition time tests. Since de-emphasis or pre-emphasis testing may require at least two same-valued consecutive bits for de-emphasis or pre-emphasis in the device under test 102 to be activated, a bit pattern such as "11001100" can be used in the testing (although any other suitable bit pattern could be used). The low-pass filters 904 could be inserted into the signal path from the device under test 102 and the testing device 100 to determine whether the signal de-emphasis or pre-emphasis in the device under test 102 performs as desired.

Although FIG. 9 illustrates one example of a testing system 900 for testing a serial transmitter or other device, various changes may be made to FIG. 9. For example, any other suitable arrangement can be used to test the device under test 102.

Figure 10:
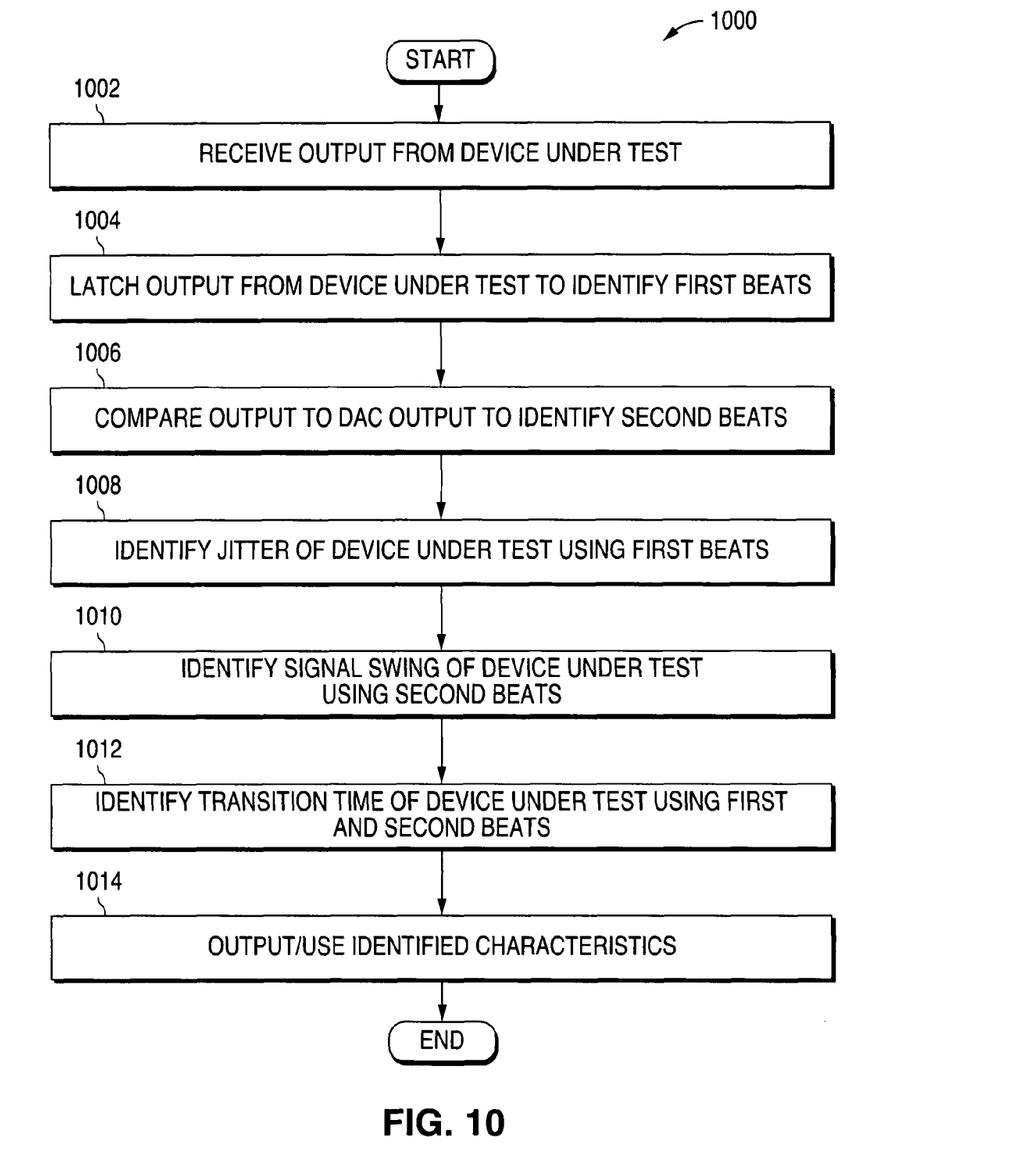
FIG. 10 illustrates an example method for testing a serial transmitter or other device in accordance with this disclosure.

FIG. 10 illustrates an example method 1000 for testing a serial transmitter or other device in accordance with this disclosure. The embodiment of the method 1000 shown in FIG. 10 is for illustration only. Other embodiments of the method 1000 could be used without departing from the scope of this disclosure. Also, for ease of explanation, the method 1000 is described with respect to the testing device 100 of FIG. 1. The method 1000 could be used by any other suitable device or system.

Output from a device under test is received at step 1002. This could include, for example, the testing device 100 receiving differential output signals produced by the device under test 102. The device under test 102 could produce the output in any suitable manner, such as by producing the differential output signals based on a known data pattern received from a pattern generator 902.

The output from the device under test is sampled to produce first beats at step 1004. This may include, for example, using the latched comparator 114 to identifying differential crossings of the differential output signals from the device under test 102. This may also include generating and latching serial bits based on the comparisons and converting multiple bit results into parallel format.

The output from the device under test is also compared to a DAC voltage to produce second beats at step 1006. This may include, for example, generating differential DAC voltage signals using the digital-to-analog converter 118 based on inputs received from the analysis unit 130. The DAC voltage signals could vary over time, such as shown in Equation (4). This may also include comparing the differential output signals from the device under test 102 to the differential output signals from the digital-to-analog converter 118 using the comparator 116. This may further include latching the result of the comparison and converting multiple comparison results into parallel format.

A jitter associated with the device under test is identified using the first beats at step 1008. This may include, for example, measuring the jitter using variations in the edges of the first beats. As a particular example, the analysis unit 130 could use the technique shown in Equation (3) to determine the total jitter for the device under test 102.

A differential signal swing of the device under test is identified using the second beats at step 1010. This could include, for example, the analysis unit 130 identifying the differential signal swing based on the adjustments made to the digital-to-analog converter 118 during the testing.

A transition time of the device under test is identified using the first and second beats at step 1012. This could include, for example, the analysis unit 130 identifying the transition time as the time period between two second beats surrounding each first beat.

The identified characteristics of the device under test are output or used in some other way at step 1014. This could include, for example, the analysis unit 130 providing the identified jitter, signal swing, and transition time to an external component (such as a PC or external tester). This could also include the analysis unit 130 storing the identified characteristics in an internal or external memory for later analysis or use. This could further include the analysis unit 130 comparing the identified characteristics to acceptable characteristics and determining whether the device under test 102 passes or fails the test (although this function could also be performed by an external component).

Although FIG. 10 illustrates one example of a method 1000 for testing a serial transmitter or other device, various changes may be made to FIG. 10. For example, while shown as a series of steps, various steps shown in FIG. 10 could overlap, occur in parallel, or occur in a different order.

It may be advantageous to set forth definitions of certain words and phrases that have been used within this patent document. The term "couple" and its derivatives refer to any direct or indirect communication between two or more components, whether or not those components are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation. A controller may be implemented in hardware, firmware, software, or some combination of at least two of the same. The functionality associated with any particular controller may be centralized or distributed, whether locally or remotely.

While this disclosure has described certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention as defined by the following claims.

What is claimed is:

1. A method comprising:
generating a plurality of first beats based on a comparison of first differential signals to one another using a first comparator, the first differential signals from a device under test;
generating a plurality of second beats based on a comparison of (i) the first differential signals and (ii) second differential signals from a digital-to-analog converter using a second comparator;
receiving at an analyzer the first and second beats, the analyzer coupled to outputs of the first and second comparators; and
determining one or more characteristics of the device under test using the first and second beats at the analyzer.

2. The method of claim 1, wherein determining the one or more characteristics of the device under test comprises determining a jitter associated with the device under test using the first beats.

3. The method of claim 2, wherein determining the jitter comprises:
determining edge widths of multiple first beats; and
averaging the edge widths to identify the jitter.

4. The method of claim 1, wherein determining the one or more characteristics of the device under test comprises determining a differential signal swing associated with the device under test using the second beats.

5. The method of claim 4, wherein determining the differential signal swing comprises:
altering control values provided to the digital-to-analog converter to identify a toggling in a comparator output; and
identifying the differential signal swing based on the identified toggling.

6. The method of claim 1, wherein determining the one or more characteristics of the device under test comprises determining a transition time associated with the device under test using the first and second beats.

7. The method of claim 6, wherein determining the transition time comprises:
identifying a first time period from one of the first beats to a subsequent one of the second beats;
identifying a second time period from another of the first beats to a preceding one of the second beats; and
summing the first and second time periods to identify the transition time.

8. The method of claim 6, wherein determining the transition time comprises identifying a time period between two of the second beats surrounding one of the first beats.

9. The method of claim 1, wherein:
a first latched comparator compares the first differential signals;
a second latched comparator compares the first differential signals and the second differential signals; and
the latched comparators are clocked by a clock signal having a frequency shift with respect to a frequency of the device under test.

10. An apparatus comprising:
a first comparator configured to receive first differential signals from a device under test and to compare the first differential signals to one another and generate a plurality of first beats;
a second comparator configured to compare (i) the first differential signals and (ii) second differential signals from a digital-to-analog converter and generate a plurality of second beats; and
an analyzer coupled to outputs of the first and second comparators and configured to receive the plurality of first beats from the first comparator, a receive the plurality of second beats from the second comparator, and determine one or more characteristics of the device under test using the first and second beats.

11. The apparatus of claim 10, wherein the analyzer is configured to determine a jitter associated with the device under test.

12. The apparatus of claim 10, wherein the analyzer is configured to determine a differential signal swing associated with the device under test by:
altering control values provided to the digital-to-analog converter to identify a toggling in the output of the second comparator; and
identifying the differential signal swing based on the identified toggling.

13. The apparatus of claim 10, wherein the analyzer is configured to determine a transition time associated with the device under test by:
identifying a first time period from one of the first beats to a subsequent one of the second beats;
identifying a second time period from another of the first beats to a preceding one of the second beats; and
summing the first and second time periods to identify the transition time.

14. The apparatus of claim 10, wherein the analyzer is configured to determine a transition time associated with the device under test by identifying a time period between two of the second beats surrounding one of the first beats.

15. The apparatus of claim 10, further comprising:
a voltage-controlled oscillator configured to generate a clock signal for the first and second comparators, the clock signal having a frequency shift with respect to a frequency of the device under test; and
a second digital-to-analog converter configured to receive control values from the analyzer and generate a control voltage for the voltage-controlled oscillator.

16. The apparatus of claim 10, wherein:
the analyzer comprises a field programmable gate array; and the apparatus further comprises first and second serial-to-parallel converters configured to convert the outputs of the first and second comparators into parallel format.

17. A system comprising:
a device under test; and
a testing device comprising:
  a first comparator configured to receive first differential signals from the device under test and generate a plurality of first beats based on a comparison of the first differential signals to one another;
  a second comparator configured to generate a plurality of second beats based on a comparison of (i) the first differential signals and (ii) second differential signals from a digital-to-analog converter; and
  an analyzer coupled to outputs of the first and second comparators and configured to determine one or more characteristics of the device under test using the first and second beats.

18. The system of claim 17, wherein the testing device is configured to determine a jitter associated with the device under test.

19. The system of claim 17, wherein the testing device is configured to determine a differential signal swing associated with the device under test by:
  altering control values provided to the digital-to-analog converter to identify a toggling in the output of the second comparator that compares the first and second differential signals; and
  identifying the differential signal swing based on the identified toggling.

20. The system of claim 17, wherein the testing device is configured to determine a transition time associated with the device under test by at least one of:
  identifying two time periods each associated with a different one of the first beats and a different one of the second beats; and
  identifying a time period between two of the second beats surrounding a single one of the first beats.

* * * * *